(12) United States Patent
Akram et al.

(10) Patent No.: US 6,469,532 B2
(45) Date of Patent: Oct. 22, 2002

(54) APPARATUS FOR FORMING COAXIAL SILICON INTERCONNECTS

(75) Inventors: Salman Akram; David R. Hembree; Alan G. Wood, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/068,082

(22) Filed: Feb. 6, 2002

(65) Prior Publication Data

US 2002/0084796 A1 Jul. 4, 2002

Related U.S. Application Data

(63) Continuation of application No. 09/722,866, filed on Nov. 27, 2000, which is a continuation of application No. 09/467,437, filed on Dec. 20, 1999, now Pat. No. 6,175,242, which is a continuation of application No. 08/982,328, filed on Dec. 2, 1997, now Pat. No. 6,028,436.

(51) Int. Cl.[7] ............................................. G01R 31/02
(52) U.S. Cl. ..................... 324/755; 324/754; 324/758
(58) Field of Search ................................. 324/755, 754, 324/757, 758, 760, 765, 158.1

(56) References Cited

U.S. PATENT DOCUMENTS

| 4,899,107 A | 2/1990 | Corbett et al. |
|---|---|---|
| 4,937,653 A | 6/1990 | Blonder et al. |
| 5,073,117 A | 12/1991 | Malhi et al. |
| 5,123,850 A | 6/1992 | Elder et al. |
| 5,177,439 A | 1/1993 | Liu et al. |
| 5,302,891 A | 4/1994 | Wood et al. |
| 5,323,035 A | 6/1994 | Leedy |
| 5,326,428 A | 7/1994 | Farnworth et al. |
| 5,378,981 A | 1/1995 | Higgins |
| 5,402,077 A | 3/1995 | Agahdel et al. |
| 5,406,210 A | 4/1995 | Pedder |
| 5,451,165 A | 9/1995 | Cearley-Cabbiness et al. ... 439/71 |
| 5,469,072 A | 11/1995 | Williams et al. ............. 324/754 |
| 5,475,317 A | 12/1995 | Smith ......................... 324/760 |
| 5,478,779 A | 12/1995 | Akram ........................ 437/189 |
| 5,483,741 A | 1/1996 | Akram et al. ................. 29/846 |
| 5,506,514 A | 4/1996 | Difrancesco ................. 324/757 |
| 5,517,752 A | 5/1996 | Sakata et al. ................. 29/832 |
| 5,565,767 A | 10/1996 | Yoshimizu et al. ...... 324/158.1 |
| 5,572,140 A | 11/1996 | Lim et al. .................... 324/755 |
| 5,678,301 A | 10/1997 | Gochnour et al. ............ 29/827 |
| 6,175,242 B1 | 1/2001 | Akram et al. ............... 324/755 |

Primary Examiner—N. Le
Assistant Examiner—T. R. Sundaram
(74) Attorney, Agent, or Firm—TraskBritt

(57) ABSTRACT

An interconnect apparatus for testing bare semiconductor dice comprises raised contact members on a semiconductive substrate. The contact members are covered with an insulation layer an a conductive cap connected by a conductive trace to a testing circuit. The trace is covered with coaxial layers of a silicon-containing insulation an a metal for shielding the trace from "crosstalk" and other interference. An apparatus for simultaneous testing of multiple dies on a wafer has thermal expansion characteristic matching those of the semiconductor die or wafer and provides clean signals.

23 Claims, 10 Drawing Sheets

APPARATUS FOR FORMING COAXIAL SILICON INTERCONNECTS

CROSS REFERENCE TO RELATED APPLICATIONS

This application is a continuation of application Ser. No. 09/722,866, filed Nov. 27, 2000, which is a continuation of application Ser. No. 09/467,437, filed Dec. 20, 1999, now U.S. Pat. No. 6,175,242, issued Jan. 16, 2001, which is continuation of application Ser. No. 08/982,328, filed Dec. 2, 1997, now U.S. Pat. No. 6,028,436, issued Feb. 22, 2000.

BACKGROUND OF THE INVENTION

1. Field of the Invention

This invention relates generally to methods for testing semiconductor circuitry for operability. More particularly, the invention pertains to interconnects and methods for fabrication thereof which are suitable for testing circuits of a bare die or multiple dice of an unsingulated wafer substantially without or with minimal "crosstalk" or other electrical interference.

2. State of the Art

In the current state of the art, bare semiconductor dice are finding increased use in constructions of multi-chip-modules (MCM) having a large number of dice. MCM are particularly vulnerable to semiconductor die defects, because if only one of the multiple, e.g., 10–30 or more dice, is defective, the module is considered defective and is generally discarded at considerable monetary loss. Thus, for example, if the individual die has a mean acceptance rate of 98.0 percent, a series of MCM, each with 25 dice, would have a predicted overall acceptance rate of about 70 percent, which is unacceptable from the standpoint of production cost and resulting price to the customer. A MCM having a greater number of dice will have a lower acceptance rate.

In view of requirements for greater reliability of increasingly complex integrated circuits such as are included in (MCM), semiconductor manufacturers now supply bare, i.e., unencapsulated, dice which have been pretested for operability in accordance with a set of specifications. Dice meeting the manufacturer's test specifications are certified as known-good-die (KGD).

Considerable effort has been expended to develop test equipment and methods for accurately testing an individual or discrete semiconductor die to enable KGD certification. For example, apparatus for conducting burn-in tests for a discrete die are disclosed in U.S. Pat. No. 4,899,107 to Corbett et al. and U.S. Pat. No. 5,302,891 to Wood et al., both patents assigned to Micron Technology, Inc. Other test apparatus for a discrete die are disclosed in U.S. Pat. No. 5,123,850 to Elder et al., and U.S. Pat. No. 5,073,117 to Malhi et al., both assigned to Texas Instruments, and in U.S. Pat. No. 5,451,165 to Cearley-Cabbiness et al., U.S. Pat. No. 5,475,317 to Smith, U.S. Pat. No. 5,572,140 to Lim et al., 5,406,210 to Pedder, U.S. Pat. No. 5,378,981 to Higgins III, U.S. Pat. No. 5,402,077 to Agahdel et al., and U.S. Pat. No. 5,565,767 to Yoshimizu et al.

In order to test a discrete semiconductor die, temporary electrical connections must be made between the bond pads on a bare semiconductor die and the external test circuitry of the test apparatus using the bond pads of the die to provide the connection points for testing the integrated circuit of the die. Bond pads on semiconductor dice are typically formed of layers of various metals, such as aluminum, copper, nickel, gold, alloys thereof, or solder of various metallurgies. The bond pads of semiconductor die for connections thereto are typically formed in a flat, planar configuration or as a raised bump.

The test apparatus for discrete semiconductor dice use various techniques for making a nonpermanent connection to the bond pads of a semiconductor die. The Wood et al. patent shows a die contact member that uses nonbonded TAB (tape automated bonding) technology. The Elder et al. apparatus uses a flexible connection member having an arrangement of probe bumps or members for temporary contact with the wire bond pads of the semiconductor die. The Malhi et al. apparatus uses an arrangement of cantilevered probe tips to contact the bond pads of the semiconductor die.

In U.S. Pat. No. 5,326,428 to Farnworth et al., a method for fabricating a probe is disclosed which is used for nonpermanent test contact with a bond pad on a semiconductor die.

U.S. Pat. No. 5,517,752 to Sakata et al. discloses a probe provided on a pressure-connector terminal used for TAB and COG connection to the bond pads of the semiconductor die.

One disadvantage of prior art test fixtures for semiconductor die testing, such as probe cards, is that their use often results in electronic interference, i.e., "crosstalk" between fixture leads, even at what are considered to be moderate frequencies for testing the die. This problem essentially precludes the application of existing test fixtures such as probe cards to the simultaneous testing of multiple bare semiconductor dice. Another problem in testing multiple semiconductor dice in wafer form is that of misalignment and disconnection of contact members from bond pads of dice being tested resulting from a probe card and a wafer containing the dice, each having different coefficients of thermal expansion (CTE). Thus, each discrete semiconductor die of a wafer or MCM must be separately tested, one at a time, resulting in much greater testing time and expense than are desirable. The need for apparatus and methods enabling rapid testing of multiple bare semiconductor dice is evident.

BRIEF SUMMARY OF THE INVENTION

The present invention comprises a shielded raised contact member for nonpermanent connection to a semiconductor die or dice for testing thereof. The invention also comprises methods for fabricating the contact member and interconnects using such fabrication methods. The traces connected to the raised contact members on the interconnect are coaxially covered with a metal layer and an intervening insulation layer such as silicon dioxide. The invention also encompasses an improved multiple contact test device, e.g., probe card for testing a singulated semiconductor die or a plurality of semiconductor dice, for example, in wafer form. The metal shielding substantially prevents or minimizes interference or "crosstalk" which has, in the past, prevented simultaneous, high-speed testing of multiple semiconductor dice for KGD certification. In a preferred embodiment, the substrate of the test device is formed of the same semiconductive material as the die(s) under test, e.g., silicon, whereby the CTE are matched. Misalignment of contact members with bond pads of the semiconductor die or dice during the connection step and disconnection of contact members of the interconnect from the bond pads during the test (due to temperature change of the probe card and die(s)) is avoided. The present invention further provides for the control of the depth of penetration of contact members with respect to the bond pads of the semiconductor device or the deformation of the bond pads during the connection step.

BRIEF DESCRIPTION OF THE SEVERAL VIEWS OF THE DRAWINGS

The invention is illustrated in the following figures, wherein the elements are not necessarily shown to scale. Corresponding parts are identified by the same numerals throughout the drawings.

DETAILED DESCRIPTION OF THE INVENTION

Figure 1:
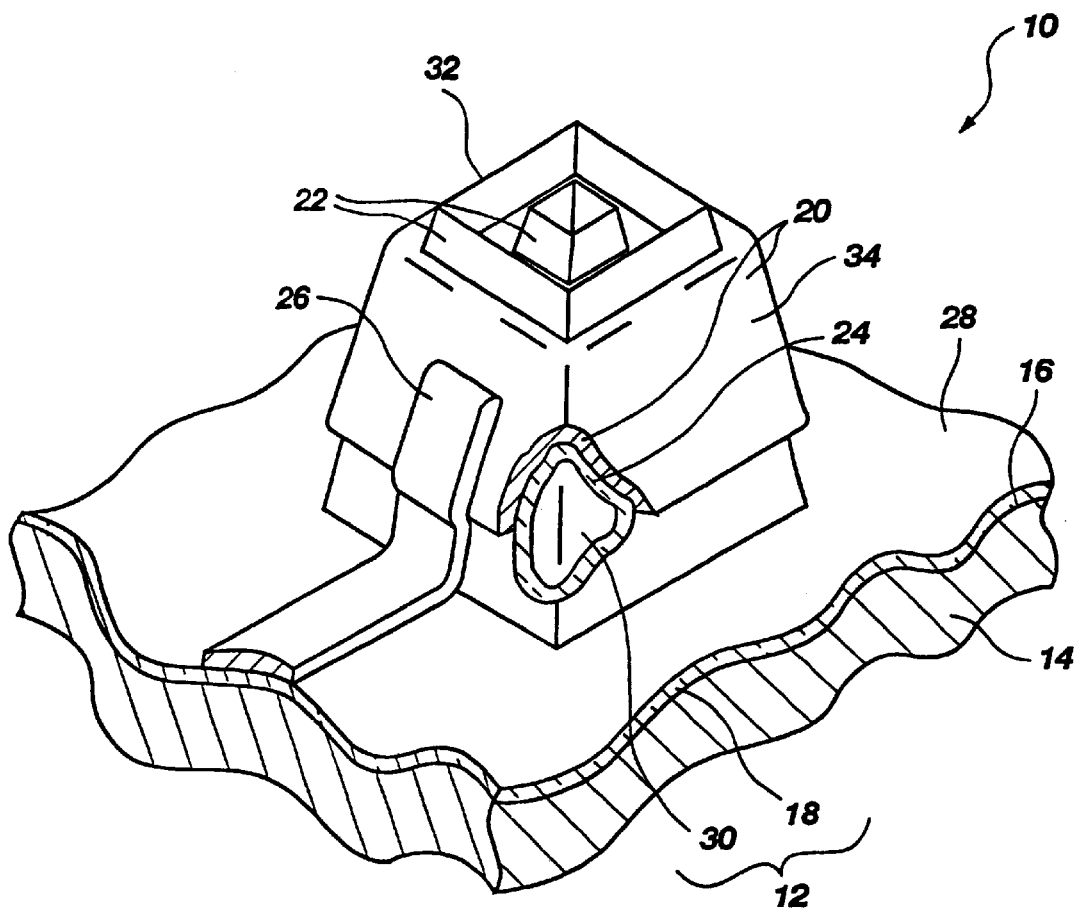
FIG. 1 is a perspective view of a prior art contact member on a substrate fragment.

Shown in drawing FIG. 1 is a prior art raised interconnect as fabricated by a method disclosed in commonly owned U.S. Pat. No. 5,478,779 to Akram. This patent, together with commonly owned U.S. Pat. No. 5,326,428 to Farnworth et al. and U.S. Pat. No. 5,483,741 to Akram et al., are incorporated by reference herein. The present invention is illustrated as comprising improvements upon the interconnect apparatus disclosed in these references, but is not limited to such constructions.

In the prior art raised interconnect 10 of FIG. 1, the interconnect includes a substrate 12 formed largely of a semiconducting (SC) material member 14 such as monocrystalline silicon. The SC material member. 14 has a planar outer surface 16 having an insulating layer 18 of a material such as silicon oxide formed thereon. The insulating layer 18 may be formed using a suitable deposition process such as chemical vapor deposition (CVD) or by exposure of the outer surface 16 to an oxidizing atmosphere for a short time.

The interconnect 10 of the prior art, as shown in drawing FIG. 1, has raised contact members 34, each formed on a pillar 30 of the SC material (see cutaway portion). Each contact member 34 has a pillar cap 20 of conductive metal, e.g., aluminum, with a pattern 32 of projecting apexes 22 for temporary intimate conductive contact with a wire bond pad of a semiconductor die. A layer 24 of insulating material such as silicon dioxide is interposed between the SC material of the pillar 30 and the pillar cap 20. A conductive trace or lead 26 overlies the external surface 28 of substrate 12 and is connected to the metal pillar cap 20 and to a test circuit for testing a semiconductor die. The number of such interconnects 10 on an interconnect, e.g., test card, for testing a bare semiconductor die corresponds to the required number of contacts with wire bond pads necessary for the tests. A test card may be provided, and used repeatedly, for each semiconductor die configuration.

While this prior art interconnect 10 is an improvement over previously used devices, its use, like that of prior devices, may result in interference or "crosstalk" between adjacent conductive traces 26, particularly because of coupling at higher frequencies.

Figure 21:
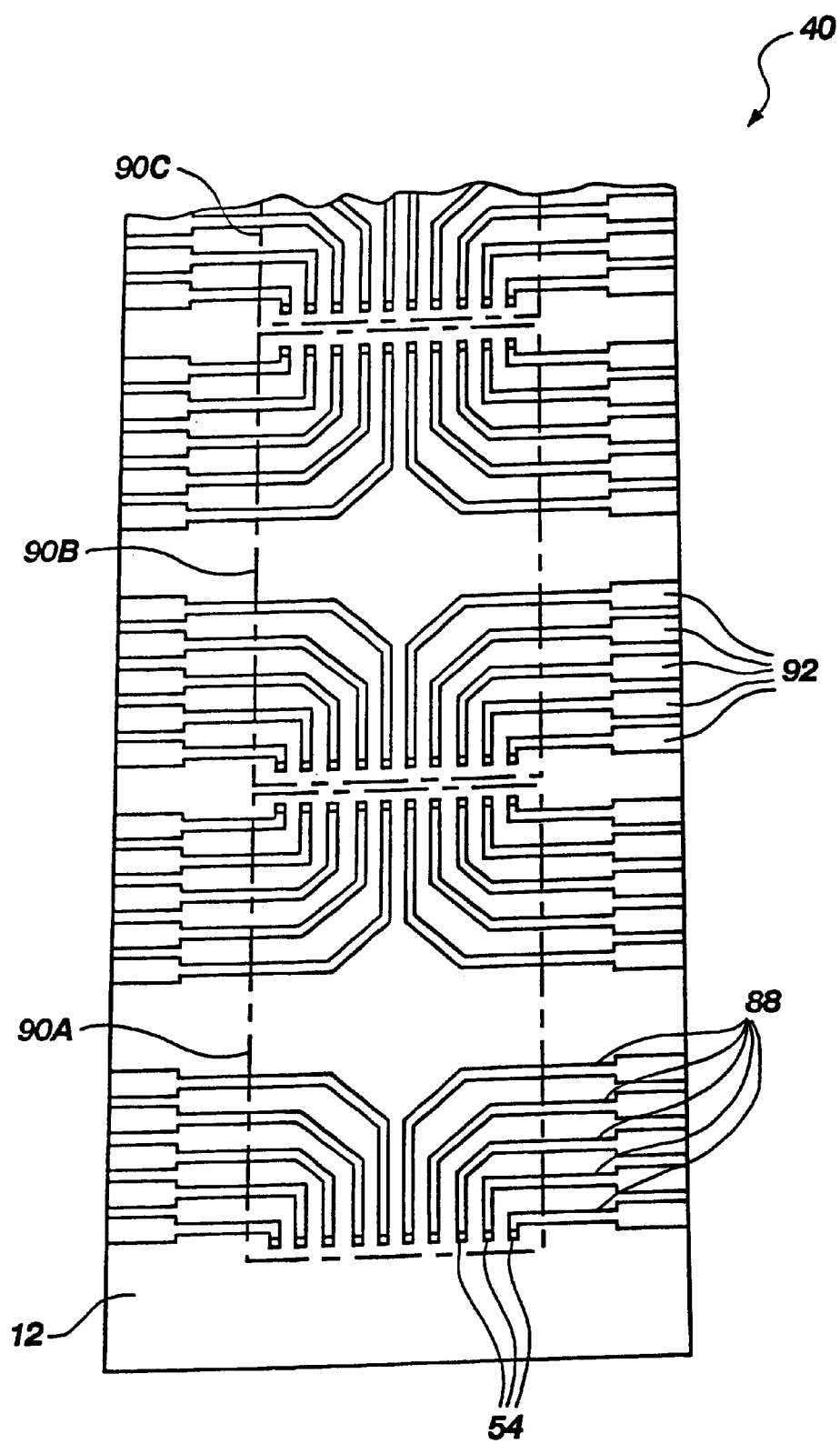
FIG. 21 is a plan view of an interconnect of the invention for simultaneously testing a plurality of bare dies.

In accordance with the present invention, electronic and electromagnetic interference between traces and between raised contact members 34 is effectively eliminated as a factor in test results by incorporating a metallic shield over each trace and over a major portion of each contact member 34 of an interconnect 40 (see FIG. 21). The metallic shield suppresses coupling between adjacent conductors and other sources of electromagnetic noise, enabling accurate testing under a much wider spectrum of signal strengths and frequencies. Multiple semiconductor dice located on a wafer may be simultaneously tested with a single testing apparatus using the present invention.

One method of producing a shielded interconnect of the invention uses method steps of the above-cited, commonly owned patents to form a precursor interconnect which is subsequently modified to provide an improved interconnect. In one embodiment of the present invention, the steps are illustrated in drawing FIGS. 2 through 21.

Figure 2:
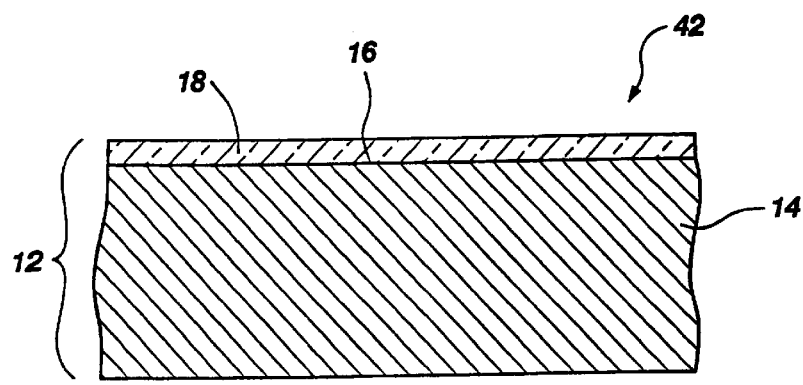
FIG. 2 is a schematic cross-sectional view of a portion of a semiconductor substrate showing an initial process step for forming a shielded contact member in accordance with the invention.

Referring now to drawing FIG. 2, an initial step in forming interconnect 40 of the present invention from a substrate 12 is depicted using a fragment 42 of the substrate 12. The substrate 12 includes a bulk substrate 14, comprising a first material which preferably comprises a semiconductor. More preferably, the first material constitutes silicon. The first material is preferred to have the same or as nearly the same coefficient of thermal expansion (CTE) as the dice to be tested.

A layer of second insulating material 18 is provided atop the planar outer surface 16 of the bulk substrate 14. The composition of the second insulating material is selected to be capable of substantially masking the underlying first material from oxidation when the semiconductor substrate is exposed to oxidizing conditions. Where the underlying material, i.e., bulk substrate 14, is silicon, the second material may be silicon nitride ($Si_3N_4$). A typical thickness for insulating material layer 18 may be from about 500 Å to about 3000 Å, with about 1600 Å being preferred.

Figure 3:
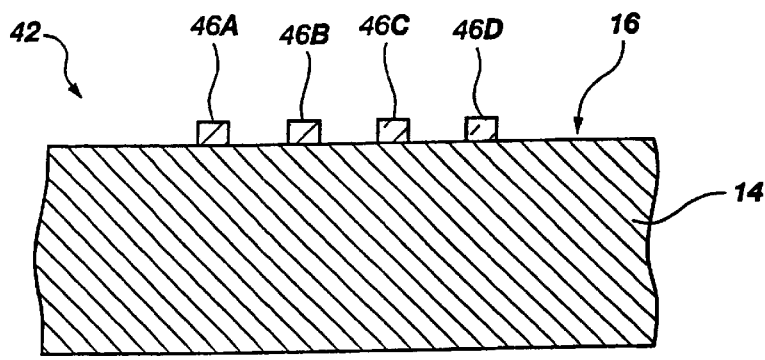
FIG. 3 is a schematic cross-sectional view of the substrate showing another step of the method of the invention, as taken along line 3—3 of FIG. 4 or 5.
Figure 4:
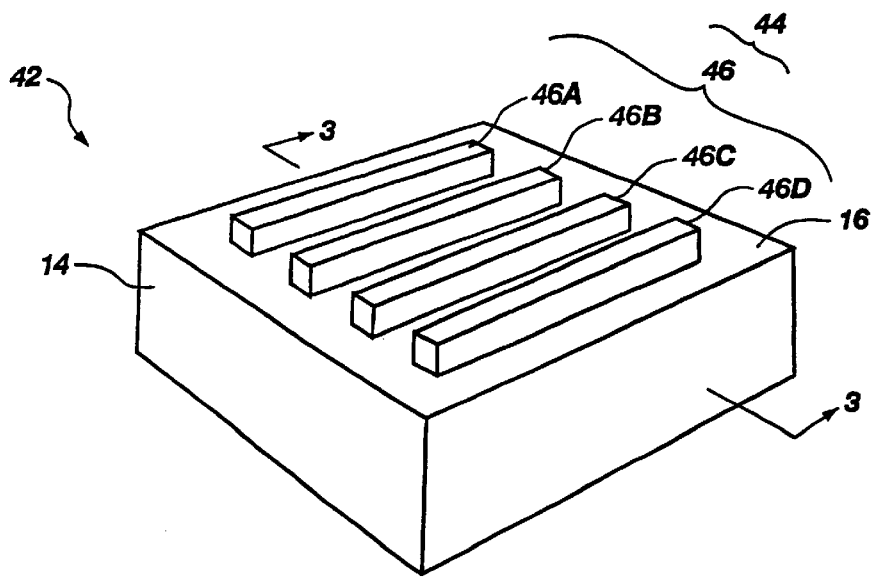
FIG. 4 is a perspective view of the substrate following the step of the method of the invention depicted in FIG. 3.

Referring to drawing FIGS. 3 and 4, second insulating material layer 18 is patterned and etched to selectively outwardly expose the bulk substrate 14 and define an array 44 of discrete first material hard masking blocks 46 (i.e., 46A, 46B, 46C, and 46D). Depending on the materials used for the second insulating material layer 18, this etch step may be performed with a dry etch or wet etch. For example, an insulating material layer 18 of silicon nitride may be etched using hot (e.g., 180° C.) phosphoric acid.

Figure 5:
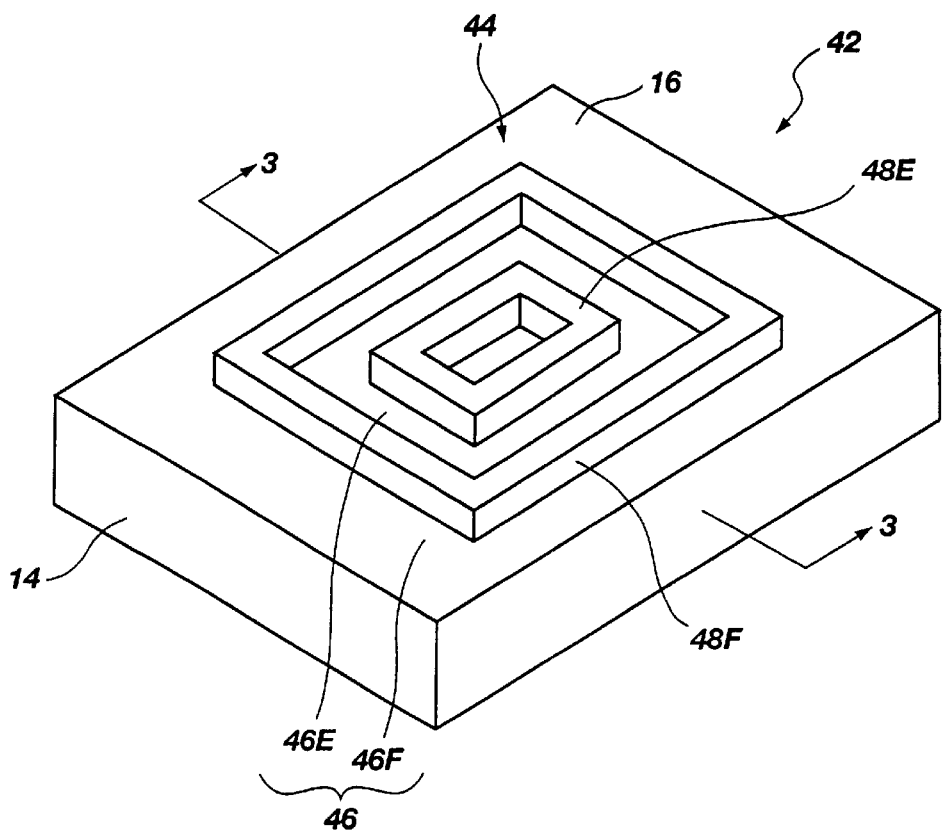
FIG. 5 is a perspective view of another embodiment of the substrate of the method of the invention depicted in FIG. 3.

As shown in drawing FIGS. 3 and 4, the masking blocks 46A, 46B, 46C and 46D are formed in a parallel spaced array 44 and are sized and shaped to fit within the perimeters of a generally rectangular or square shaped bond pad of a semiconductor die to be tested, for example, a bond pad of the size of about 100 μm×100 μm. As is evident, such a parallel spaced array 44 is merely exemplary. Other suitable arrangements of the masking blocks 46 include enclosed rectangles, squares, triangles, circles, T-shapes and X-shapes. Illustrated in drawing FIG. 5 is an alternate array 44 of masking blocks 46E and 46F comprising a pair of generally concentric enclosed rectangles 48E, 48F. It is observed that for the particular arrays 44 of drawing FIGS. 4 and 5, the cross-sectional views along line 3—3 are coincidentally the same (see drawing FIG. 3).

Figure 6:
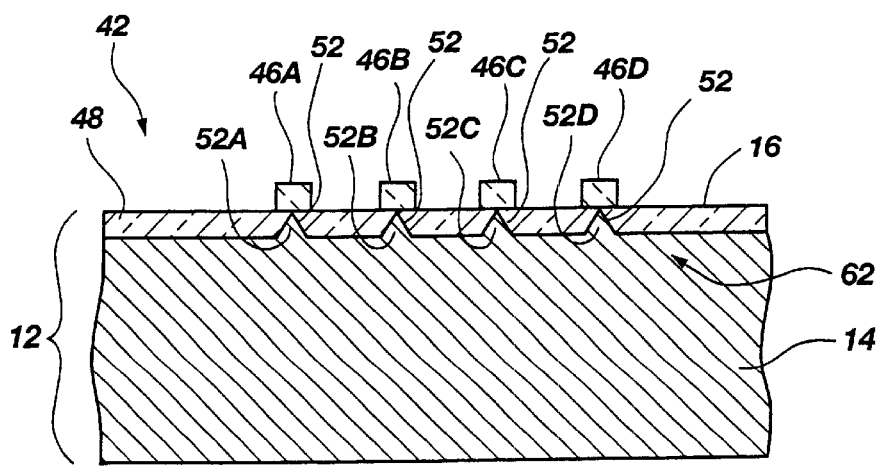
FIG. 6 is a schematic cross-sectional view of the substrate showing another step in the method of the invention.

Next, as shown in drawing FIG. 6, a wet or dry isotropic or anisotropic etch process is used to form projecting apexes 52A, 52B, 52C and 52D on the bulk substrate material 14. For an anisotropic etch, in which the etch rate differs in different directions, an etchant solution containing a mixture of KOH and water may be used. This anisotropic etch results in the formation of triangular tipped apexes 52 shown in drawing FIG. 6 as apexes 52A, 52B, 52C and 52D. This is a result of the differing etch rates of monocrystalline silicon along the different crystalline orientations. For an isotropic etch, in which the etch rate is the same in all directions, an etchant solution containing an aqueous mixture of HF and $HNO_3$ may be used. However, in such an anisotropic etching process, the insulating layer 48 will not form and, therefore, would not be present.

Alternatively, in place of etching, the substrate 12 may be subjected to an oxidizing atmosphere to oxidize portions of the substrate not covered by the masking blocks 46. As an example, the oxidizing atmosphere may comprise a mixture of steam and $O_2$ at an elevated temperature (e.g., 950° C.). The oxidizing atmosphere oxidizes the exposed portions of the substrate 12 and forms an insulating layer 48 of e.g., silicon dioxide. At the same time, projecting apexes 52 are formed under the masking blocks 46. The projecting apexes 52 may also be formed by a deposition process from a material other than the substrate 12. The projecting apexes 52 form an array 62 corresponding to the array 44 of masking blocks 46.

Figure 7:
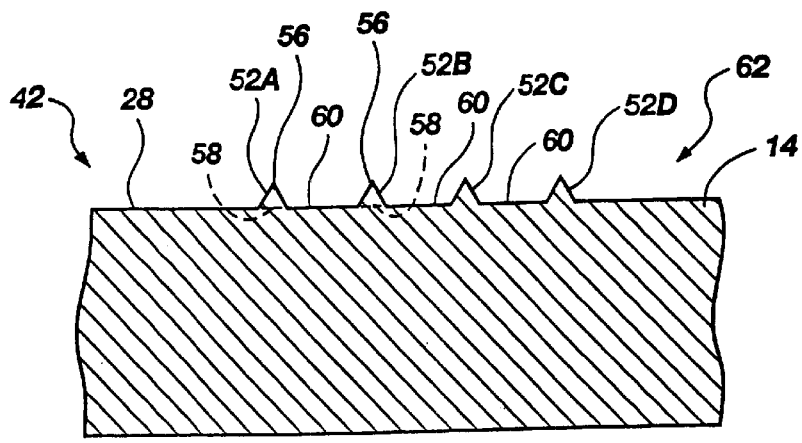
FIG. 7 is a schematic cross-sectional view of the substrate showing another step in the method of the invention, as taken along line 7—7 of FIG. 8.

Next, as shown in drawing FIG. 7, the masking blocks 46A, 46B, 46C and 46D are stripped using a wet etchant such as $H_3PO_4$ that is selective to the substrate 12. With an oxidizing process, the insulating layer 48 is stripped using a suitable wet etchant such as HF.

Figure 8:
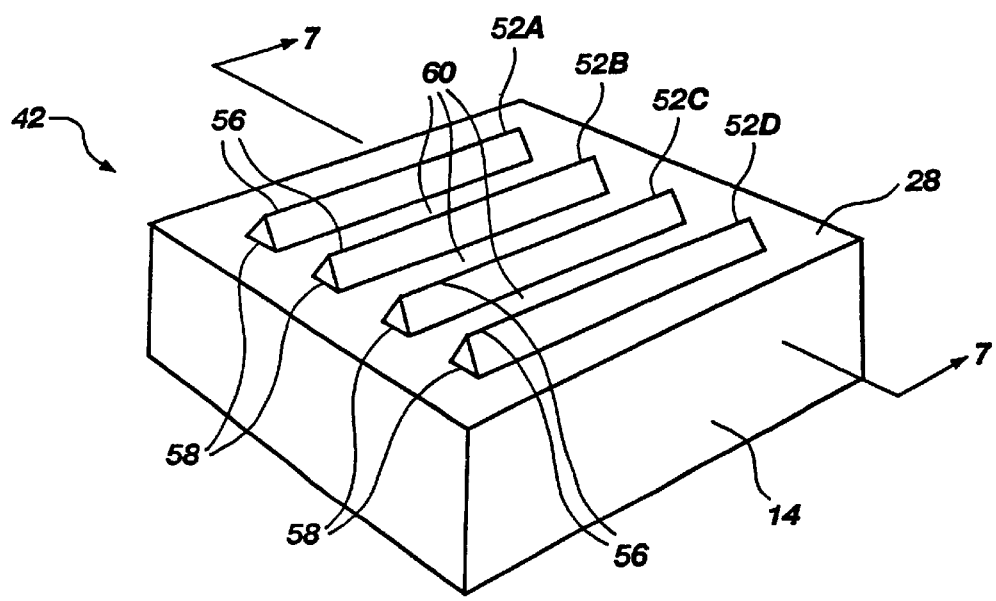
FIG. 8 is a perspective view of the substrate following the step of the method of the invention depicted in FIG. 7.

As illustrated in drawing FIGS. 7 and 8, the steps of patterning, etching and stripping form projecting apexes 52 (i.e., 52A, 52B, 52C and 52D) which are in the shape of substantially parallel spaced knife edges. The projecting apexes 52 form an array 62 projecting from the substrate surface 28. The array 62 has an overall peripheral dimension which falls within the boundaries of a bond pad on a semiconductor die to be tested. Although drawing FIG. 8 shows multiple knife edges formed for contact with each bond pad, it is to be understood that each raised contact member 54 (FIG. 12) to be formed may have a single knife edge or multiple knife edges patterned in a wide variety of arrays 62.

The projecting apexes 52 project from surface 28 of the substrate 12 and include tips 56 and bases 58. If desired, additional etching may be used to sharpen the tips 56 following formation of the apexes 52.

The bases 58 of adjacent projecting apexes 52 are spaced from one another a distance sufficient to define a penetration stop plane 60 therebetween. An exemplary spacing between apexes 52 is about 10 μm, and the length of an individual stop plane 60 may be, for example, about 3 to 10 μm. The tip 56 and base 58 of each projecting apex 52 are spaced apart by a projecting distance preferred to be about one-half the thickness of a bond pad on a semiconductor die to be tested. In this manner, the penetration of each projecting apex 52 into a bond pad of a semiconductor die or the deformation of the material forming the bond pad of a semiconductor die may be carefully controlled along with the amount of force that each bond pad and the active surface of a semiconductor die is subject to during the testing process.

Figure 9:
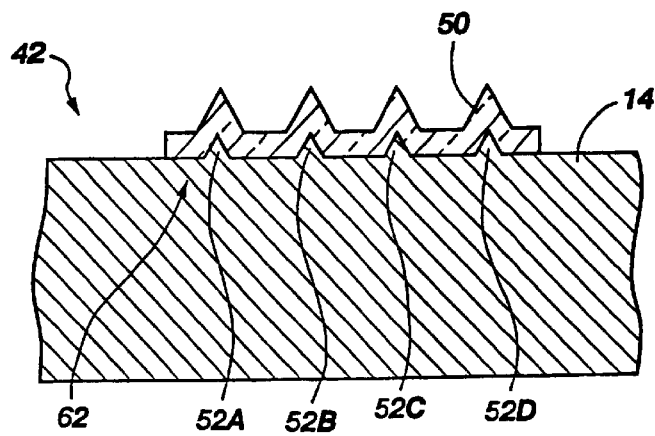
FIG. 9 is a schematic cross-sectional view of the substrate showing another step in the method of the invention.
Figure 10:
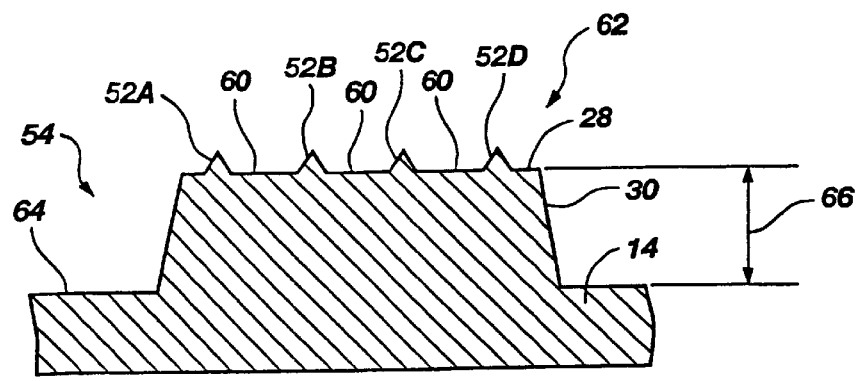
FIG. 10 is a schematic cross-sectional view of the substrate showing another step in the method of the invention, as taken along line 10—10 of FIG. 11.
Figure 11:
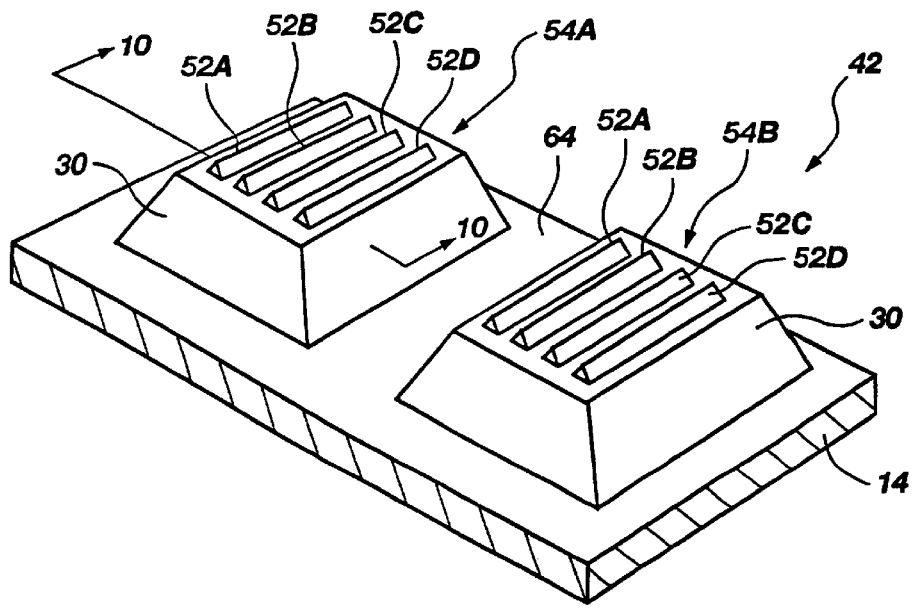
FIG. 11 is a perspective view of the substrate following the step of the method of the invention depicted FIG. 10.

In the next step, illustrated in drawing FIG. 9, all of the projecting apexes 52 in array 62 are covered with a nitride masking layer 50 and photopatterned. As shown in drawing FIGS. 10 and 11, the bulk substrate 14 is etched around the masking layer 50 to form raised contact members 54 with pillars 30. Typical etching techniques include wet anisotropic etching with a mixture of $KOH:H_2O$, known in the art as bulk micromachining. The contact members 54 are numbered, sized and spaced to contact the desired bond pads of a semiconductor die to be tested. A typical test apparatus will have a large number of contact members 54. Thus, a contact member 54 may have projecting apexes 52 within a planar square of surface 28 of side dimensions of about 40–80 μm. The array 62 of apexes 52 of each contact member 54, i.e., 54A, 54B . . . 54N is dimensioned to fall within the perimeter of a bond pad. The height 66 of each contact member 54, between the surface 28 of the stop plane 60 and the surface 64 of the thinned bulk substrate 14 is such that all of the finally configured raised contact members 54 can readily be connected with accuracy to the bond pads of a semiconductor die. A typical height 66 of the contact members is about 50–100 μm.

The method for fabricating this embodiment further includes the formation of a conductive layer 70, such as a metal or metal silicide (see drawing FIG. 16), on the tip of each contact member 54, and the formation of conductive traces or leads 26 from the contact members to a circuit for testing or other purpose. These steps are illustrated in drawing FIGS. 12–16.

Figure 12:
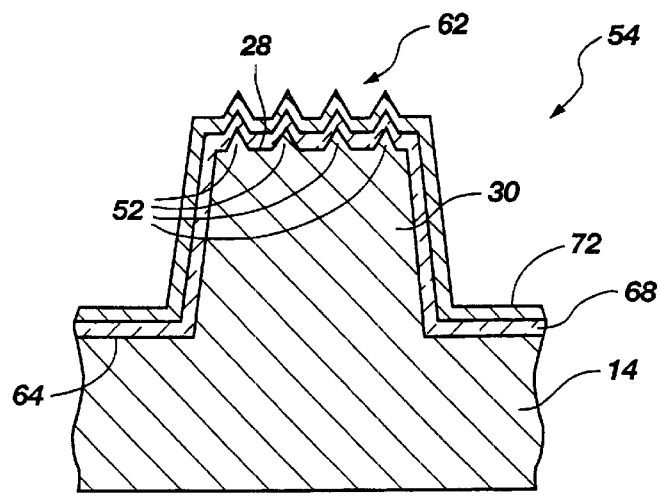
FIG. 12 is a schematic cross-sectional view of the substrate showing another step in the method of the invention.

As shown in drawing FIG. 12, an insulating layer 68 (e.g., $SiO_2$) is formed on surface 64 of the bulk substrate 14, the pillar 30, surface 28 and the array 62 of apexes 52. The insulating layer 68 may be formed by oxidation of the bulk substrate 14, e.g., by exposing the bulk substrate 14 to an oxidizing atmosphere for a short time. Silicon dioxide may also be deposited using CVD. Another insulator useful in this insulating layer 68 is $Si_3N_4$.

As illustrated in drawing FIG. 12, a silicon-containing layer 72 comprising polysilicon (doped or undoped), amorphous silicon (doped or undoped), or other silicon is deposited on the insulating layer 68 by CVD or epitaxial growth process. The silicon-containing layer 72 is required to form a silicide with a metal layer 80 (see drawing FIG. 15) during subsequent processing.

Figure 13:
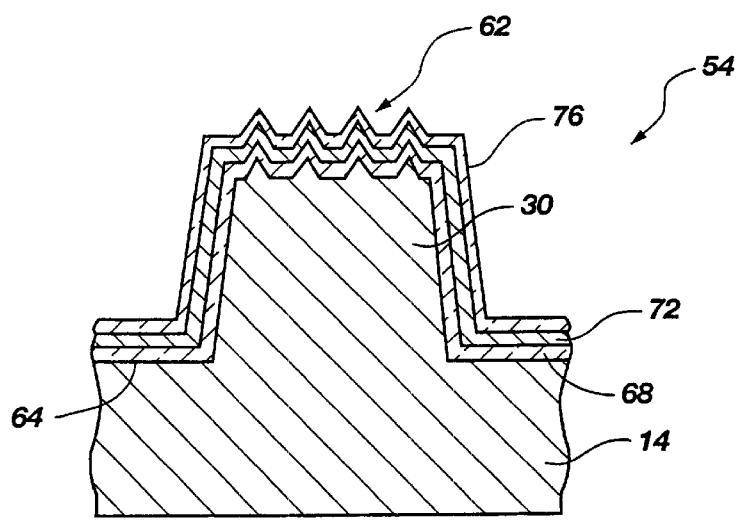
FIG. 13 is a schematic cross-sectional view of the substrate showing another step in the method of the invention.

As shown in drawing FIG. 13, a second insulating layer 76 (e.g., $SiO_2$) is formed on the silicon-containing layer 72. The layer 76 may be deposited by CVD or by exposing the layer 72 to an oxidizing environment. The second insulating layer 76 is typically about 500–3000 Å in thickness.

Figure 14:
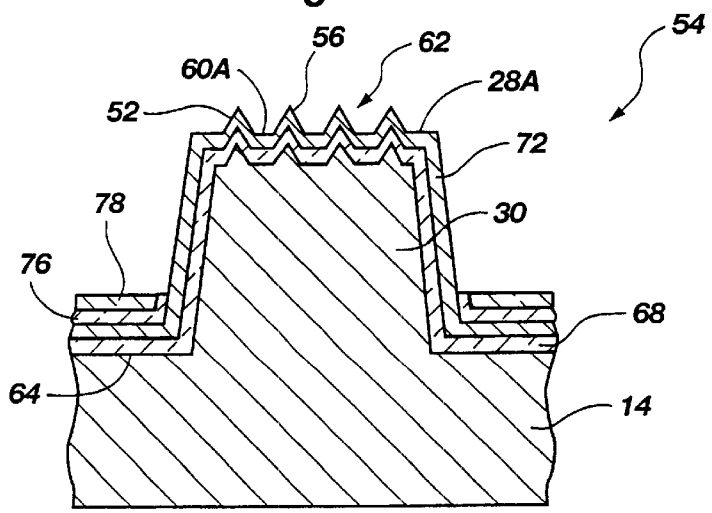
FIG. 14 is a schematic cross-sectional view of the substrate showing another step in the method of the invention.

In drawing FIG. 14, a layer 78 of photoresist is formed on the second insulating layer 76 by a spin-on or other deposition process such that the second insulating layer 76 on the upper portion of each contact member 54 is not effectively covered. After development of the photoresist layer 78, the second insulating layer 76 is removed by e.g., etching, leaving the silicon-containing layer 72 exposed on the tip 56 of the contact member 54, including the knife edged apexes 52, penetration stop planes 60A and surface 28A coplanar therewith.

Figure 15:
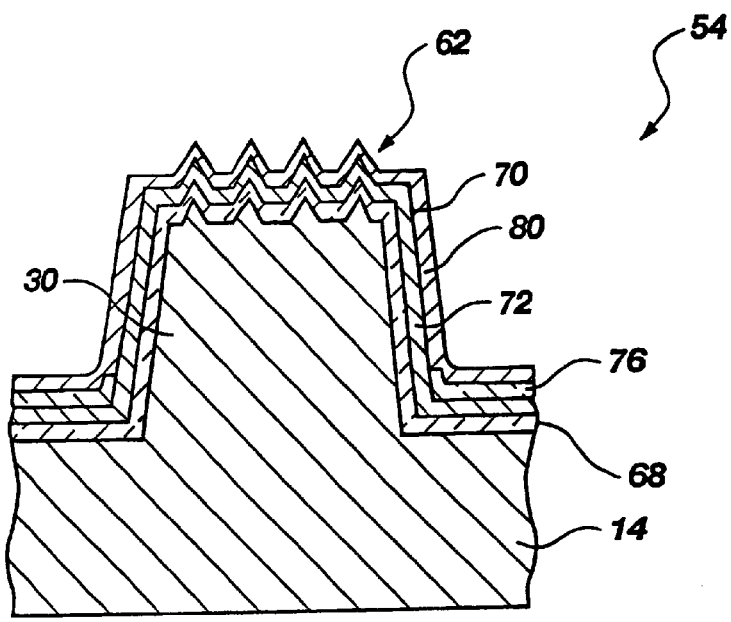
FIG. 15 is a schematic cross-sectional view of the substrate showing another step in the method of the invention.
Figure 16:
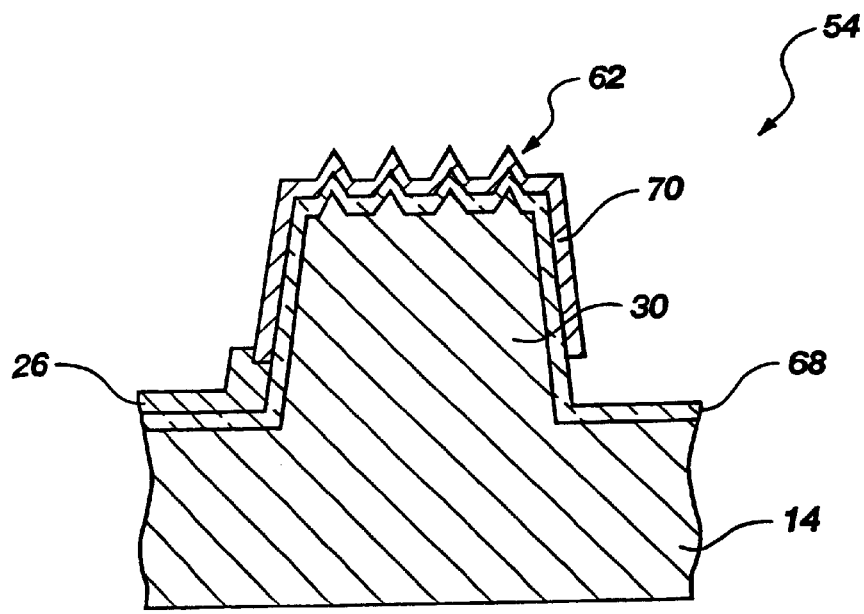
FIG. 16 is a schematic cross-sectional view of the substrate showing another step in the method of the invention.

Next, as shown in drawing FIG. 15, the photoresist layer 78 is removed and a metal layer 80 is deposited on the exposed silicon-containing layer 72. The metal layer 80 covers the silicon-containing layer 72 on the tip and sidewalls of the contact member 54, including the array 62 of apexes 52. In addition, the metal layer 80 covers the second insulating layer 76. The metal layer 80 may be deposited to a thickness of about 500–3000 Å using a deposition process such as low pressure chemical vapor deposition (LPCVD), sputtering or evaporation techniques.

The metal layer 80 reacts with the silicon-containing layer 72 to form a metal silicide. Suitable metals include titanium, tungsten, tantalum, platinum, and molybdenum, as well as cobalt, nickel, copper, gold and iridium.

The silicon-containing layer 72 and metal layer 80 are sintered at e.g., about 650–820° C. to form a conductive layer 70 of silicide alloy such as $TiSi_2$. Next, unreacted portions of the silicon-containing layer 72 and metal layer 80 are etched away using known methods. The contact member 54 may be annealed to reduce the resistivity of the conductive silicide layer 70.

Conductive traces 26 of a second metal, polysilicon or other conductor may be formed on the insulating layer 68 to provide a conductive path in electrical contact with the conductive silicide layer 70. Referring to drawing FIGS. 1 and 16, the completed raised contact member 54 as fabricated by the prior art method is shown.

Thus far, the described method comprises one method of several known methods for fabricating a contact member 54. The following steps comprise a method of fabricating an improvement in the exemplary contact member 54 and other contact members in accordance with the invention.

Figure 17:
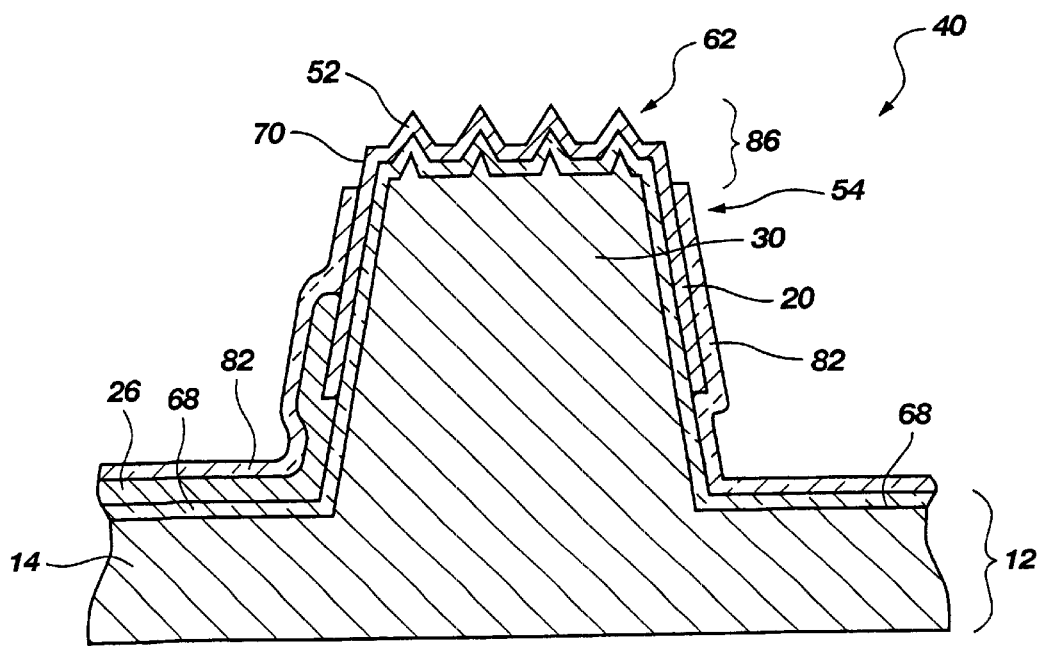
FIG. 17 is a schematic cross-sectional view of the substrate showing another step in the method of the invention.

Turning now to drawing FIG. 17, the method of the invention comprises the step of applying a third insulation layer 82 of e.g., silicon dioxide or silicon nitride over the top and sides of conductive metal trace 26. The silicon dioxide third insulation layer 82 may also be applied over the lower portion of the pillar 30, i.e., below the array 62 of apexes 52 and including portions of the pillar cap 20, to avoid contact of the silicon dioxide third insulation layer 82 with a bond pad. In fact, the third insulation layer 82 may be applied to the entire surface of the substrate 12 with the exception of the tip portions 86 of the contact members 54. If so configured, the third insulation layer 82 will largely overlie the insulating layer 68. If coated with the third insulation layer 82, the tip portions 86 of the raised contact members 54 may be etched to remove the insulation and expose the conductive pillar caps 20.

The silicon dioxide third insulation layer 82 may be formed by methods known in the art, e.g., CVD. In one embodiment, portions of the third insulation layer 82 may be etched to remove it from areas not adjacent to conductive traces 26 and contact members 54.

Following the application and any partial etching of the third insulation layer 82, a metal layer 84 is applied over the third insulation layer 82, at least over the portions overlying the traces 26 and portions of the contact members 54 other than the tip portions 86. The metal layer 84 comprises a shield over each trace 26 and over a substantial portion of each contact member 54 to greatly reduce, minimize, or eliminate crosstalk and other electronic and electromagnetic interference between traces 26 and between contact members 54.

The metal layer 84 may comprise any material which will block high frequency electrical and electromagnetic radiation and may be, for example, aluminum, titanium, tungsten, nickel, silver, molybdenum, copper, or other metal.

The metal layer 84 may be applied at a thickness of about 500–3000 Å using a suitable deposition process such as a LPCVD, a sputtering process, or by evaporation techniques known in the art. In one embodiment, application of the metal layer 84 is followed by a partial etching step to remove the metal from areas in which the metal will provide little or no advantage. An electrically isolated metal layer 84 may be formed over a trace 26 and contact member 54 to provide a coaxial shield.

Alternatively, a metal layer 84 may overlie all of the traces 26 and intervening portions of the substrate 12. In this latter configuration, the metal layer 84 is preferably connected to ground.

Figure 18:
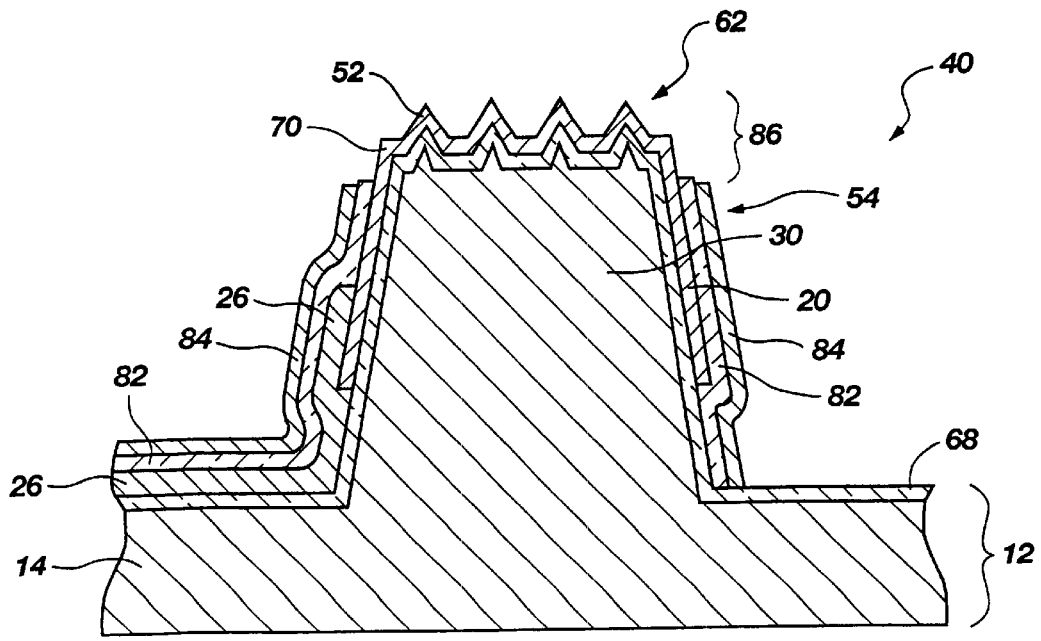
FIG. 18 is a schematic cross-sectional view of the substrate showing another step in the method of the invention, as taken along line 18—18 of FIG. 19.
Figure 19:
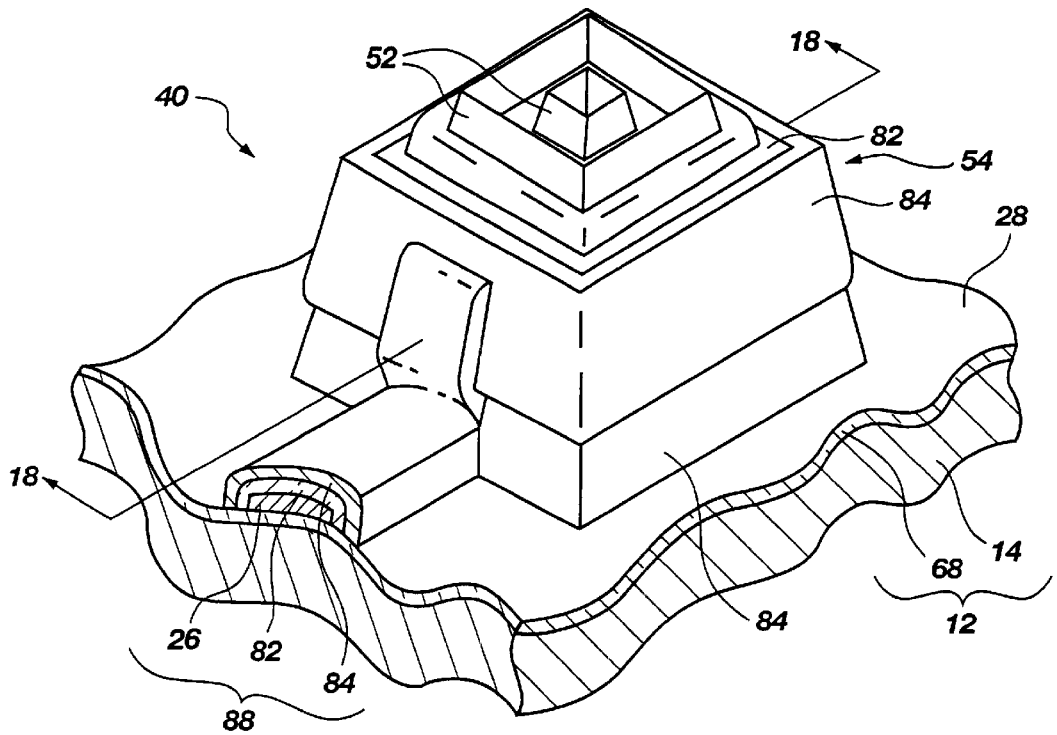
FIG. 19 is a perspective view of a portion of an interconnect of the invention in accordance with FIG. 18.

As shown in drawing FIGS. 18 and 19, the conductive trace 26 connecting the apexes 52 of the completed contact member 54 to a testing circuit is coaxially covered on the top and sides with a metal layer 84 and an intervening insulation layer 82, e.g., silicon dioxide, between the conductive trace 26 and metal layer 84. The trace 26 with insulation layer 82 and metal layer 84 is designated as shielded trace 88. In addition, all but the tip portions 86 of the raised contact member 54 are also covered with the metal layer 84 and intervening third insulation layer 82 to provide a shield against interference.

The apex array 62 is configured so that when in abutment with a bond pad on a die, the apexes 52 may be pressured to pierce the hard oxidation layer on the bond pad to engage the underlying conductive metal. The apex array 62 configuration further controls the penetration of each apex into the bond pad of a semiconductor device or the metal deformation of the material of the bond pad as well as provides a way to control the amount of force applied to each bond pad and the active surface of the semiconductor device.

Figure 20:
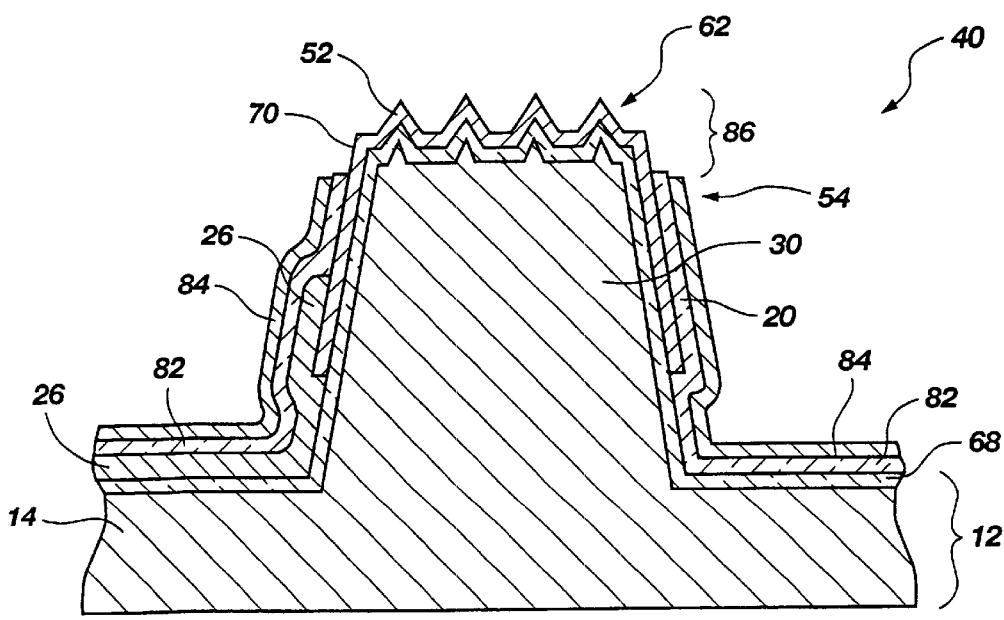
FIG. 20 is a schematic cross-sectional view of the substrate showing another embodiment of the interconnect of the invention.

In the embodiment depicted in drawing FIG. 20, the third insulative layer 82 and metal layer 84 are shown as overlying the substrate 12 as well as the conductive traces 26 and lower portions of the contact member 54.

As shown in drawing FIG. 21, a completed interconnect 40 for testing of a plurality of bare semiconductor dice on a wafer includes a semiconductive substrate 12. The interconnect 40 is configured for multiple electrical connections with the bond pads of multiple semiconductor dice of a wafer.

The interconnect 40 will be positioned to overlie the semiconductor dice having the outlines 90A, 90B and 90C as shown. The contact members 54 are temporarily joined to the respective bond pads on the semiconductor dice by pressure, thereby making electrical contact between the two, and the plurality of individual semiconductor dice may be effectively simultaneously tested. Each contact member 54 is connected to a bonding site 92 which is connected to a testing circuit, not shown, by a wire bond, TAB tape, flip chip bumps, or other types of electrical connections.

The interconnect 40 may also be configured for connection to ball-grid-arrays or other arrays on the bottom side of a semiconductor die.

As described in the prior art section of this application, there are other methods for forming raised contact members on substrates for testing semiconductor dice. The method of the invention for forming shields on interconnects includes the application to such devices as well as to the exemplary interconnect described herein.

Use of this interconnect construction results in a testing apparatus which may be configured for simultaneous multi-die testing on a wafer, greatly shortening the test time. KGD testing may be performed at lower cost. Crosstalk and other interference are essentially eliminated or minimized, so the number of dice which may be simultaneously tested is limited only by factors other than electronic interference. Misalignment and the resulting disconnection of contact members in the testing of multiple dice on a wafer are essentially eliminated.

It is apparent to those skilled in the art that various changes and modifications may be made to the interconnect construction and method for forming shielded interconnects and testing apparatuses of the invention as disclosed herein without departing from the spirit and scope of the invention as defined in the following claims.

What is claimed is:

1. A testing apparatus for a circuit of a semiconductor device having a plurality of bond pads, comprising:
    a substrate comprising semiconductor material, said substrate having a surface including a first layer of insulation on a portion thereof, said substrate having portions thereof for engaging said bond pads of said semiconductor device;
    a plurality of raised contact members, each raised contact member positioned on said surface of said substrate for contacting at least a portion of at least a bond pad of said bond pads of said semiconductor device;
    a plurality of conductive traces, at least one conductive trace of said plurality of conductive traces connected to each raised contact member of said plurality of raised contact members;
    a second layer of insulation overlying a portion of each of said plurality of conductive traces; and
    a conductive layer overlying a portion of said second layer of insulation providing shielding to at least one conductive trace of said plurality of conductive traces.

2. The apparatus of claim 1, wherein said second layer of insulation and said conductive layer comprise substantially continuous layers of insulation overlying each of said conductive traces, overlying said substrate located between said substrate and said at least one conductive trace, and overlying noncontact portions of said plurality of raised contact members.

3. The apparatus of claim 1, wherein said conductive layer comprises one of aluminum, titanium, tungsten, cobalt, nickel, molybdenum, and copper.

4. The apparatus of claim 1, wherein said second layer of insulation comprises silicon dioxide.

5. The apparatus of claim 1, wherein said second layer of insulation comprises silicon nitride.

6. The apparatus of claim 1, wherein said substrate consists of a semiconductor material.

7. The apparatus of claim 1, wherein said substrate comprises silicon dioxide material.

8. The apparatus of claim 1, wherein said each of said plurality of raised contact members includes a projecting apex and a stop surface located adjacent to said projecting apex.

9. A testing apparatus for a circuit of a semiconductor device having a plurality of bond pads, comprising:
    a substrate comprising semiconductor material, said substrate having an insulative surface on at least a portion thereof, said substrate to overlie at least a portion of said semiconductor device;
    a plurality of raised contact members positioned on said insulative surface on said at least a portion of said substrate for contacting a portion of each bond pad of said plurality of bond pads of said semiconductor device, each raised contact member of said plurality of raised contact members including a projecting apex and a stop surface located adjacent to said projecting apex;
    a plurality of conductive traces, at least one conductive trace of said plurality of conductive traces connected to at least one raised contact member of said plurality of raised contact members;
    a second insulative surface substantially overlying each conductive trace of said plurality of conductive traces; and
    a conductive layer overlying said second insulative surface and each said conductive trace of said plurality of conductive traces providing shielding to each said conductive trace.

10. The apparatus of claim 9, wherein said second insulative layer and said conductive layer comprise layers overlying said plurality of conductive traces, overlying said substrate located between said substrate and said plurality of conductive traces, and overlying noncontact portions of said plurality of raised contact members.

11. The apparatus of claim 9, wherein said conductive layer comprises one of aluminum, titanium, tungsten, cobalt, nickel, molybdenum, and copper.

12. The apparatus of claim 9, wherein said second insulative surface comprises silicon dioxide.

13. The apparatus of claim 9, wherein said second insulative surface comprises silicon nitride.

14. The apparatus of claim 9, wherein said substrate consists of a semiconductor material.

15. The apparatus of claim 9, wherein said substrate comprises silicon dioxide material.

16. A testing apparatus for a circuit of a semiconductor device having a plurality of bond pads, comprising:
    a substrate comprising semiconductor material, said substrate having a layer of insulating material located on at least a portion of a surface thereof, said substrate to overlie a portion of said semiconductor device;
    a plurality of raised contact members positioned on said surface of said substrate, each raised contact member of said plurality for contacting at least a portion of at least one bond pad of said plurality of bond pads of said semiconductor device;

a plurality of conductive traces, one conductive trace of said plurality of conductive traces connected to at least one raised contact member of said plurality of raised contact members;

a second layer of insulating material overlying each conductive trace of said plurality of conductive traces; and a conductive layer overlying at least a portion said second layer of insulating material.

17. The apparatus of claim 16, wherein said second layer of insulating material and said conductive layer comprise substantially continuous layers overlying said plurality of conductive traces, overlying said substrate located between said substrate and said plurality of conductive traces, and overlying noncontact portions of said plurality of raised contact members.

18. The apparatus of claim 16, wherein said conductive layer comprises one of aluminum, titanium, tungsten, cobalt, nickel, molybdenum, and copper.

19. The apparatus of claim 16, wherein said second layer of insulating material comprises silicon dioxide.

20. The apparatus of claim 16, wherein said second layer of insulating material comprises silicon nitride.

21. The apparatus of claim 16, wherein said substrate consists of a semiconductor material.

22. The apparatus of claim 16, wherein said substrate comprises silicon dioxide material.

23. The apparatus of claim 16, wherein substantially each raised contact member of said plurality of raised contact members includes a projecting apex and a stop surface located adjacent to said projecting apex.

* * * * *

UNITED STATES PATENT AND TRADEMARK OFFICE
CERTIFICATE OF CORRECTION

PATENT NO.     : 6,469,532 B2
DATED          : October 22, 2002
INVENTOR(S)    : Salman Akram, David R. Hembree and Alan G. Wood It is certified that error appears in the above-identified patent and that said Letters Patent is hereby corrected as shown below:

<u>Title page,</u>
Item [57], ABSTRACT,
Line 4, change "an" to -- and --
Line 6, change "an" to -- and --

<u>Column 3,</u>
Line 16, change "FIG." to -- FIGS. --

<u>Column 4,</u>
Line 9, delete the period after "member"

<u>Column 11,</u>
Line 11, after "portion" and before "said" insert -- of --

Signed and Sealed this

Fourth Day of November, 2003

JAMES E. ROGAN
*Director of the United States Patent and Trademark Office*